US012804782B2

(12) United States Patent
Uchida et al.

(10) Patent No.: US 12,804,782 B2
(45) Date of Patent: Nov. 17, 2026

(54) VAPOR DEPOSITION MASK WITH TAPERED INNER WALLS AND PROTRUDING PORTION AND METHOD FOR PRODUCING ORGANIC ELECTRONIC DEVICE

(71) Applicant: CANON KABUSHIKI KAISHA, Tokyo (JP)

(72) Inventors: Tatsuro Uchida, Tokyo (JP); Takahiro Yajima, Kanagawa (JP); Shinichiro Watanabe, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 437 days.

(21) Appl. No.: 18/515,813

(22) Filed: Nov. 21, 2023

(65) Prior Publication Data

US 2024/0084434 A1 Mar. 14, 2024

Related U.S. Application Data

(63) Continuation of application No. PCT/JP2022/015362, filed on Mar. 29, 2022.

(30) Foreign Application Priority Data

May 31, 2021 (JP) ................................. 2021-091159
Feb. 2, 2022 (JP) ................................. 2022-015103

(51) Int. Cl.

| | |
|---|---|
| ***H05B 33/10*** | (2006.01) |
| ***C23C 14/04*** | (2006.01) |
| ***H10K 71/16*** | (2023.01) |

(52) U.S. Cl.
CPC .......... *H05B 33/10* (2013.01); *C23C 14/042* (2013.01); *H10K 71/166* (2023.02)

(58) Field of Classification Search
CPC ..... H05B 33/10; C23C 14/042; H10K 71/166
See application file for complete search history.

(56) References Cited

U.S. PATENT DOCUMENTS

| | | | |
|---|---|---|---|
| 10,927,443 | B2 | 2/2021 | Sakio et al. |
| 11,136,664 | B2 | 10/2021 | Uchida et al. |

(Continued)

FOREIGN PATENT DOCUMENTS

| | | | |
|---|---|---|---|
| JP | 2001-185350 | A | 7/2001 |
| JP | 2004-362908 | A | 12/2004 |

(Continued)

OTHER PUBLICATIONS

International Search Report in International Application No. PCT/JP2022/015362 (Jun. 2022).

(Continued)

*Primary Examiner* — John P. Dulka
(74) *Attorney, Agent, or Firm* — Venable LLP

(57) ABSTRACT

A vapor deposition mask made of a semiconductor substrate, comprising a plurality of openings to pass vapor deposition particles, wherein an aperture portion of which opening width is smallest is disposed between an edge of the opening on a vapor deposition source side and an edge of the opening on a substrate side, the opening width on the substrate side is larger than that of the aperture portion, and at least a part of an inner wall of each of the plurality of openings has a uneven shape.

18 Claims, 12 Drawing Sheets

(56) References Cited

U.S. PATENT DOCUMENTS

| | | | | |
|---|---|---|---|---|
| 11,621,310 | B2 * | 4/2023 | Kim | C23C 14/12 257/40 |
| 11,649,540 | B2 | 5/2023 | Uchida et al. | |
| 11,859,274 | B2 | 1/2024 | Uchida et al. | |
| 2001/0019807 | A1 | 9/2001 | Yamada et al. | |
| 2006/0160026 | A1 * | 7/2006 | Yotsuya | C23C 14/042 430/311 |
| 2020/0035923 | A1 * | 1/2020 | Kawasaki | C23C 14/042 |

FOREIGN PATENT DOCUMENTS

| | | | |
|---|---|---|---|
| JP | 2008-189990 | A | 8/2008 |
| WO | 2017/168773 | W | 10/2017 |
| WO | 2018/135255 | A1 | 7/2018 |
| WO | 2022/254925 | A1 | 12/2022 |

OTHER PUBLICATIONS

Notice of Reasons for Refusal in Japanese Application No. 2022-015103 (Jan. 2026).

Itabashi et al., U.S. Appl. No. 18/479,966, filed Oct. 3, 2023.

Kodama et al., U.S. Appl. No. 18/519,447, filed Nov. 27, 2023.

* cited by examiner

30 AVERAGE OPENING WIDTH
7 PROTRUDED PORTION
31 PROTRUDED PORTION OPENING WIDTH
4 INNER WALL

10 VAPOR DEPOSITION PARTICLES
14 VAPOR DEPOSITION FILM
7 PROTRUDED PORTION
4 INNER WALL

10 VAPOR DEPOSITION PARTICLES
14 VAPOR DEPOSITION FILM
7 PROTRUDED PORTION
4 INNER WALL

10 VAPOR DEPOSITION PARTICLES
14 VAPOR DEPOSITION FILM
4 INNER WALL

PLAN VIEW

CROSS-SECTIONAL VIEW

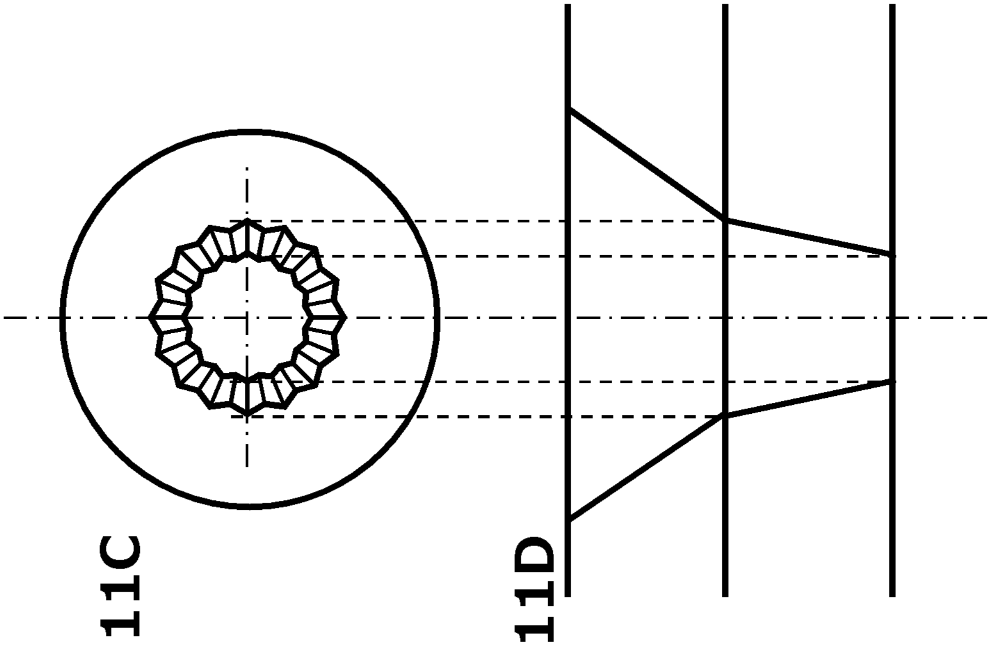
FIG. 11C
FIG. 11D
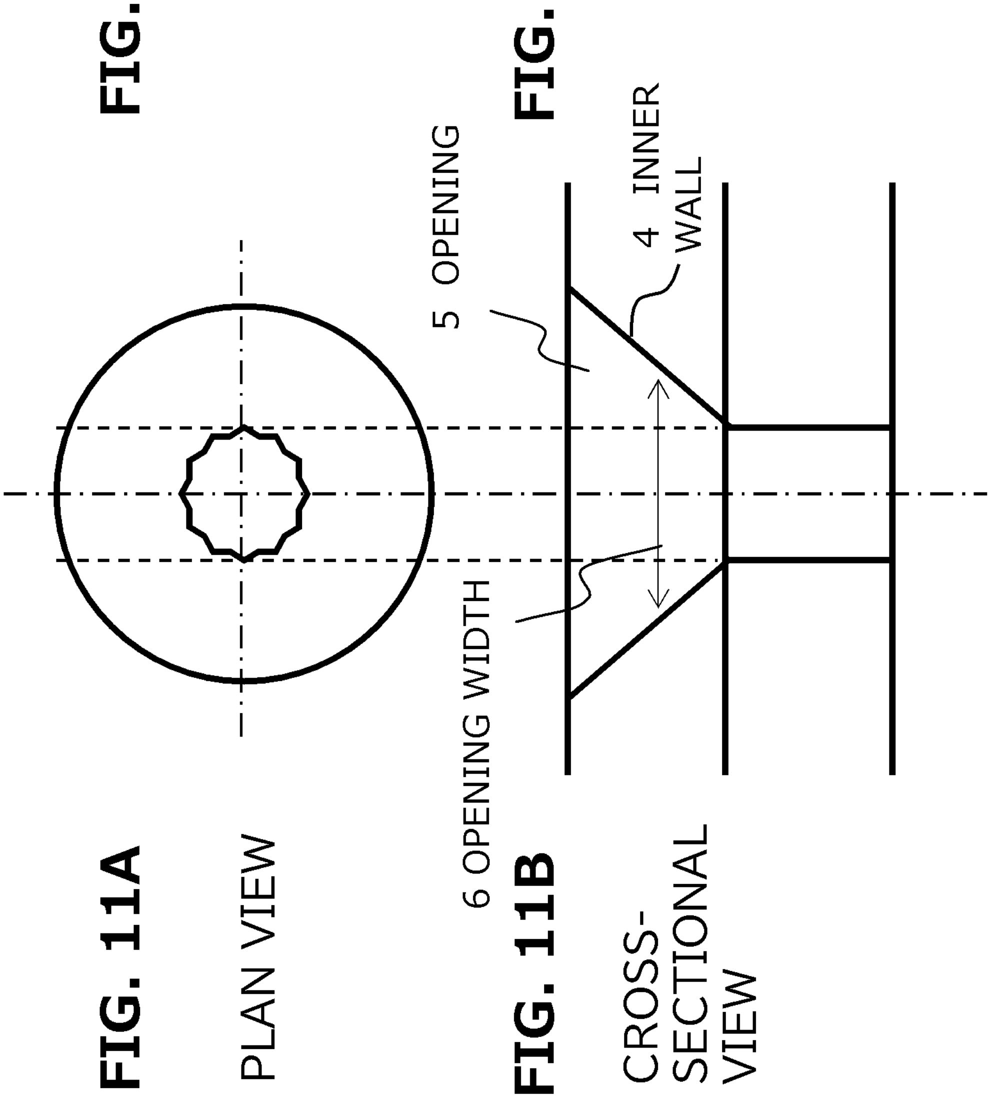
FIG. 11A
PLAN VIEW
FIG. 11B
CROSS-SECTIONAL VIEW

FIG. 12A
PLAN VIEW
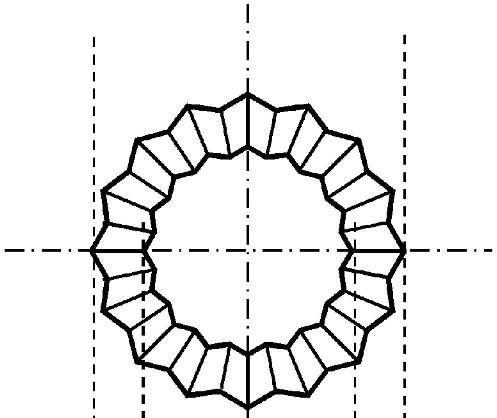
FIG. 12B
CROSS-SECTIONAL VIEW
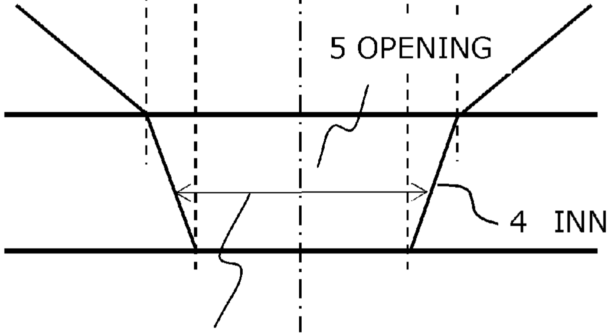
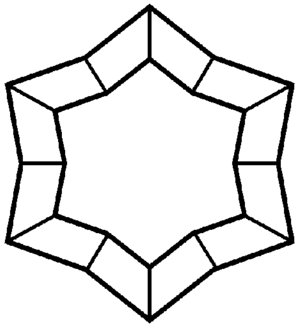
FIG. 12C
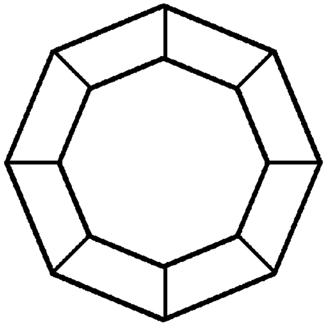
FIG. 12D
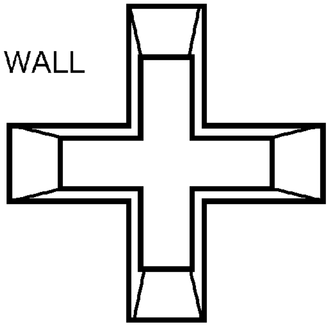
FIG. 12E
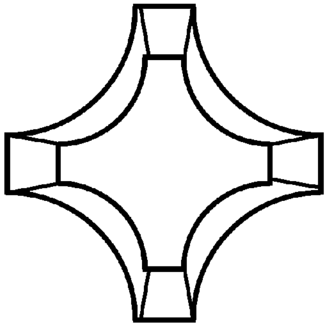
FIG. 12F

VAPOR DEPOSITION MASK WITH TAPERED INNER WALLS AND PROTRUDING PORTION AND METHOD FOR PRODUCING ORGANIC ELECTRONIC DEVICE

CROSS-REFERENCE TO RELATED APPLICATIONS

This application is a Continuation of International Patent Application No. PCT/JP2022/015362, file on Mar. 29, 2022, which claims the benefit of Japanese Patent Application No. 2021-091159, filed on May 31, 2021, and Japanese Patent Application No. 2022-015103, filed on Feb. 2, 2022, all of which are hereby incorporated by reference herein in their entirety.

BACKGROUND OF THE INVENTION

Field of the Invention

The present invention relates to a vapor deposition mask, and a method for producing an organic electronic device.

Description of the Related Art

An organic electroluminescence (EL) element is a self-emitting display element. The organic EL element has a structure of thin films, which are layered, and can perform high-speed responses. An organic EL panel (a display panel in which a plurality of organic EL elements are disposed) is attracting a lot of attention since the weight is light and an excellent moving image display is possible. The organic EL panel is used for display devices such as a flat panel display (FPD) and a compact display for an electronic view finder (EVF).

Many of organic EL panels are produced through production steps including a step of vapor-depositing an organic material on a substrate using a resistance heating type vacuum vapor deposition device. In a case of a full color organic EL panel, it is required to produce micro-display elements (light-emitting elements; pixels) of red (R), green (G) and blue (B) at high precision. Therefore, a mask vapor deposition method has been used, where three types of organic materials, corresponding to R, G and B, are vapor-deposited at desired positions (different positions) respectively using a metal mask or the like.

Producing an even higher definition organic EL panel (organic electronic device) is considered here. In this case, a higher definition of the metal mask is needed, that is, the metal mask needs to be produced to be thinner at higher precision. However, if the metal mask is thin, it is easily bend, and plastic deformation thereof becomes a major issue when tensile force is applied. In other words, processing at high precision is difficult.

PTL 1 discloses fabricating a vapor deposition mask using a silicon substrate. The silicon substrate can be processed using a semiconductor fabrication technique, such as a photolithography technique and a dry etching technique and can be processed to a several am level at high precision.

However, if the openings of the vapor deposition mask become small due to implementing high resolution, the vapor deposition film more easily deposits on the inner wall of the opening and blocks the opening, or the vapor deposition film that is deposited on the inner wall of the opening tends to peel off and reach the substrate, which makes it easy to generate pixel defects.

It is an objective of the present invention to provide a vapor deposition mask with which higher definition vapor deposition patterns can be formed at high precision than in the prior art, and to thereby provide a higher definition organic electronic device.

CITATION LIST

Patent Literature

PTL 1: Japanese Patent Application Publication No. 2001-185350

SUMMARY OF THE INVENTION

The first aspect of the present invention is a vapor deposition mask made of a semiconductor substrate, comprising a plurality of openings to pass vapor deposition particles, wherein an aperture portion of which opening width is smallest is disposed between an edge of the opening on a vapor deposition source side and an edge of the opening on a substrate side, the opening width on the substrate side is larger than that of the aperture portion, and at least a part of an inner wall of each of the plurality of openings has a uneven shape.

The second aspect of the present invention is a method for producing an organic electronic device, wherein the vapor deposition mask according to any one of claims 1 to 15 is disposed so as to face the substrate, and an organic material is vapor-deposited on the substrate through the vapor deposition mask.

According to the present invention, a vapor deposition mask, with which higher definition vapor deposition patterns can be formed at high quality, can be provided, and thereby a higher definition organic electronic device can be provided.

Further features of the present invention will become apparent from the following description of exemplary embodiments with reference to the attached drawings.

BRIEF DESCRIPTION OF THE DRAWINGS

FIG. 11A is a schematic plan view of an opening of a vapor deposition mask of Embodiment 5.

FIG. 11B is a schematic plan view of an opening of a vapor deposition mask of Embodiment 5.

FIG. 11C is a schematic cross-sectional view of a vapor deposition mask of Embodiment 5.

FIG. 11D is a schematic cross-sectional view of a vapor deposition mask of Embodiment 5.

FIG. 12A is a schematic plan view of an opening of a vapor deposition mask of Embodiment 5.

FIG. 12B is a schematic plan view of an opening of a vapor deposition mask of Embodiment 5.

FIG. 12C is a schematic cross-sectional view of a vapor deposition mask of Embodiment 5.

FIG. 12D is a schematic cross-sectional view of a vapor deposition mask of Embodiment 5.

FIG. 12E is a schematic cross-sectional view of a vapor deposition mask of Embodiment 5.

DESCRIPTION OF THE EMBODIMENTS

Figures 1A, 1B, 1C:
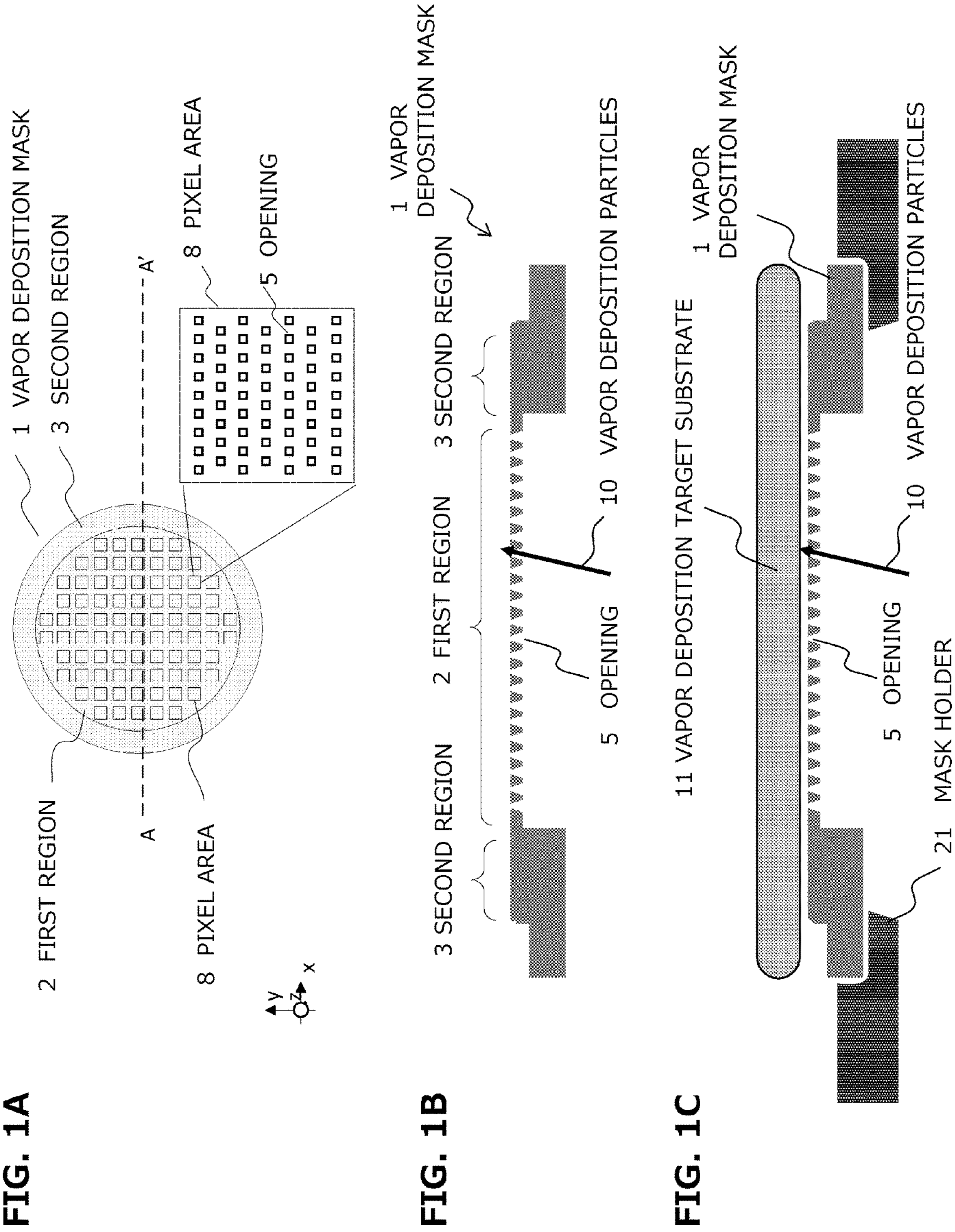
FIG. 1A is a diagram depicting a configuration of a vapor deposition mask of Embodiment 1.
FIG. 1B is a diagram depicting a configuration of a vapor deposition mask of Embodiment 1.
FIG. 1C is a diagram depicting a configuration of a vapor deposition mask of Embodiment 1.

Embodiments of the present invention will be described with reference to the drawings. The present invention, however, can be carried out in many different modes, and shall not be interpreted as limited to the contents of the following embodiments. Further, in the drawings, the width, thickness, shape, and the like of each portion may be schematically indicated to clarify the description, but these are mere examples, and are not intended to limit the interpretation of the present invention.

Problems for Attainment of Higher Definition

In the case of vapor-depositing an organic EL using a vapor deposition mask, each opening of the vapor deposition mask becomes narrower as the definition becomes higher. As an opening becomes narrower, blocking of an opening by the vapor deposition film and abnormal growth of the vapor deposition film tend to be generated more easily. Particularly when the size of the opening becomes narrow to be close to the thickness of the vapor deposition film, this problem can no longer be ignored.

Figure 7:
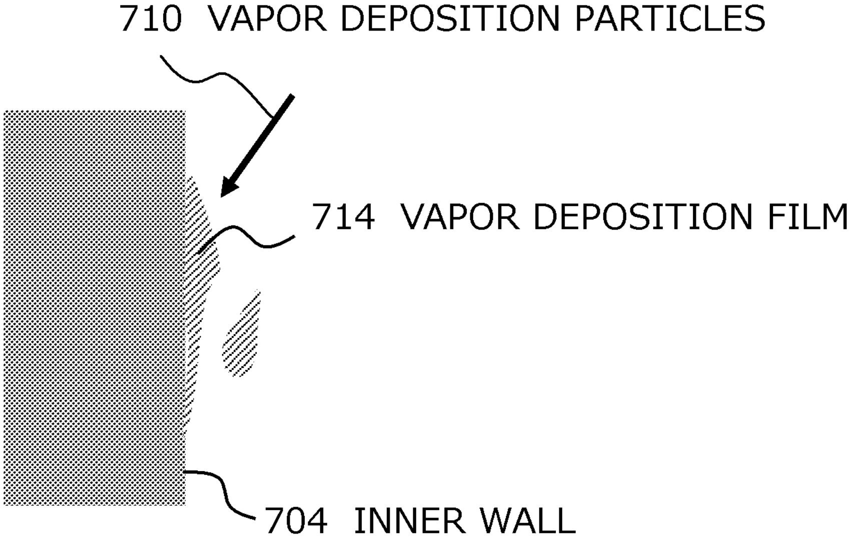
FIG. 7 is a schematic cross-sectional view of an opening of a vapor deposition mask of a prior art.

FIG. 7 is a schematic cross-sectional view of an inner wall 704 in an opening of a vapor deposition mask. The inner wall 704 is vertical, and the surface thereof is flat. Vapor deposition particles 710 adhere to the inner wall 704 and become a vapor deposition film 714. Since the surface of the inner wall 704 is flat, the vapor deposition film 714 tends to peel off from the inner wall 704 and become foreign substances as the film thickness of the vapor deposition film 714 increases. The foreign substances reach a substrate 711 by static electricity or by collision of vapor deposition particles 710 and generates pixel defects.

Figure 8A:
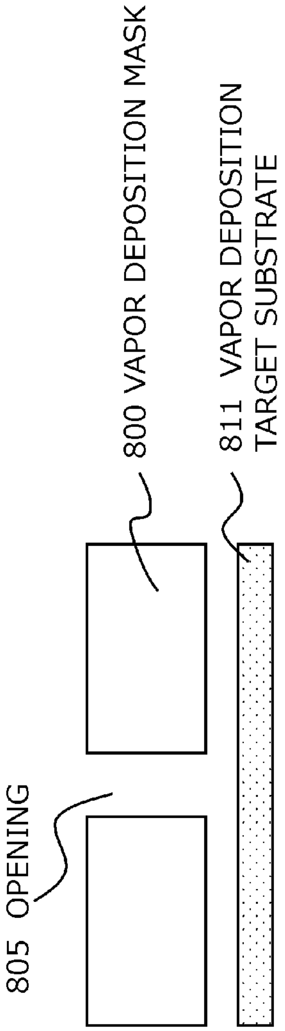
FIG. 8A is a schematic cross-sectional view of an opening of the vapor deposition mask of a prior art.
Figure 8B:
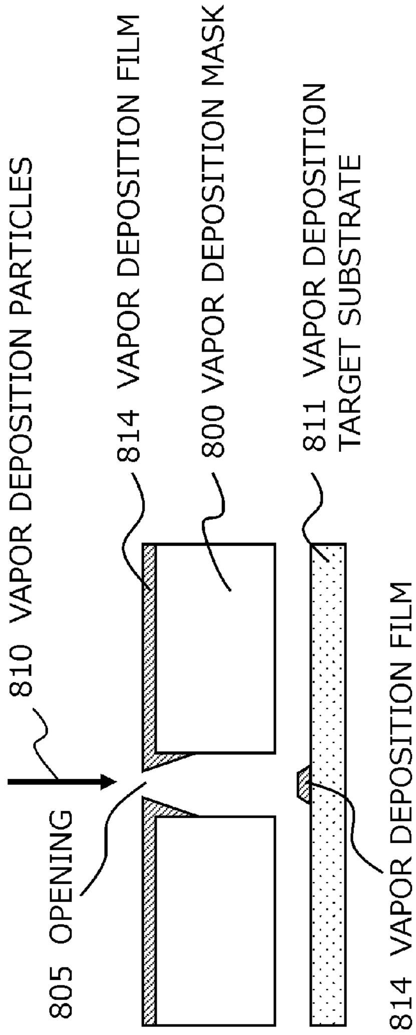
FIG. 8B is a schematic cross-sectional view of an opening of the vapor deposition mask of a prior art.
Figure 8C:
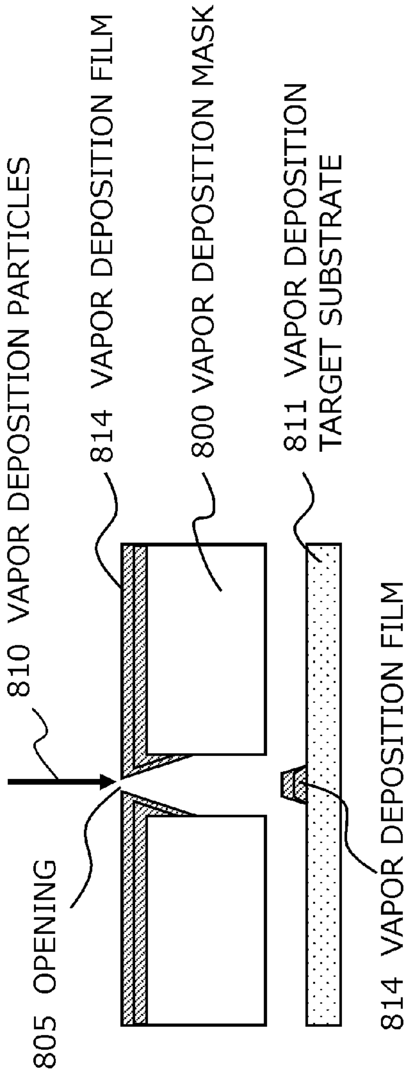
FIG. 8C is a schematic cross-sectional view of an opening of the vapor deposition mask of a prior art.

FIGS. 8A to 8C are schematic cross-sectional views of a vapor deposition mask 800, on which an opening 805 having a vertical cross-section is formed. FIG. 8A indicates a state of the vapor deposition mask 800 before a vapor deposition film 814 adheres, FIG. 8B indicates a state of the vapor deposition mask 800 in the initial stage of vapor deposition, and FIG. 8C indicates a state of the vapor deposition mask 800 in the later stage of vapor deposition.

As illustrated in FIG. 8A, the inner wall of the opening 805 is vertical, and the surface thereof is flat. As illustrated in FIGS. 8B and 8C, when vapor deposition particles 810 adhere to the vapor deposition mask 800, a vapor deposition film 814 is deposited around the opening 805, whereby the size of the opening 805 decreases. If the size of the opening 805 decreases, a shadow is generated, and the vapor deposition area on the substrate 811 decreases. As a result, a light-emitting element having sufficient characteristics cannot be fabricated.

"Shadow" here refers to a phenomenon where a part of the vapor deposition particles 810 emitted from the vapor deposition source collides with the inner wall of the opening 805 of the vapor deposition mask 800 and is interrupted in reaching the (substrate 811), and accordingly a film thickness becomes thinner than a target film thickness.

Figure 9A:
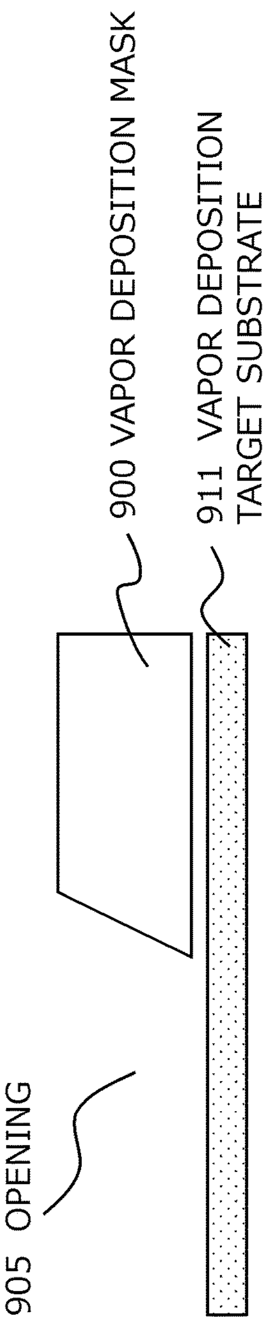
FIG. 9A is a schematic cross-sectional view of an opening of the vapor deposition mask of a prior art.
Figure 9B:
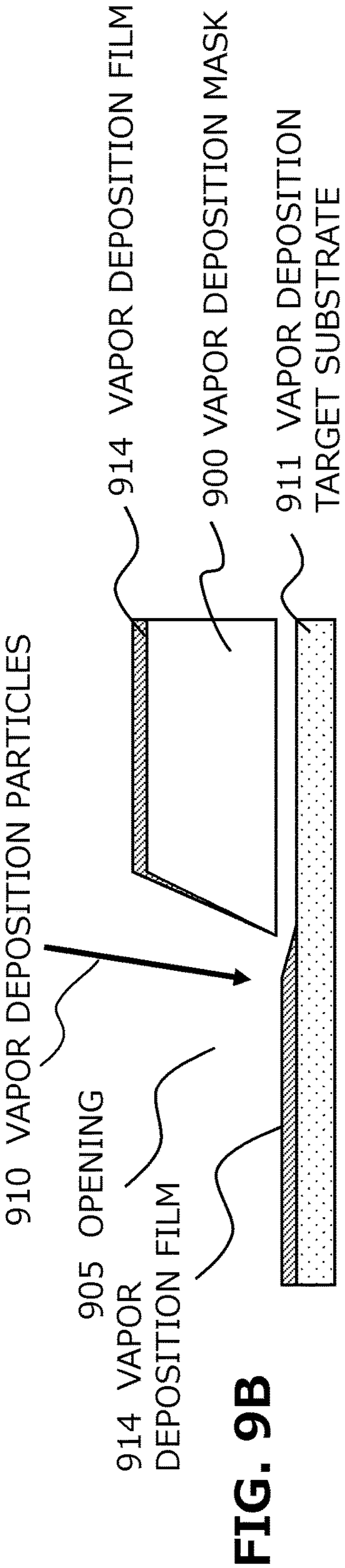
FIG. 9B is a schematic cross-sectional view of an opening of the vapor deposition mask of a prior art.
Figure 9C:
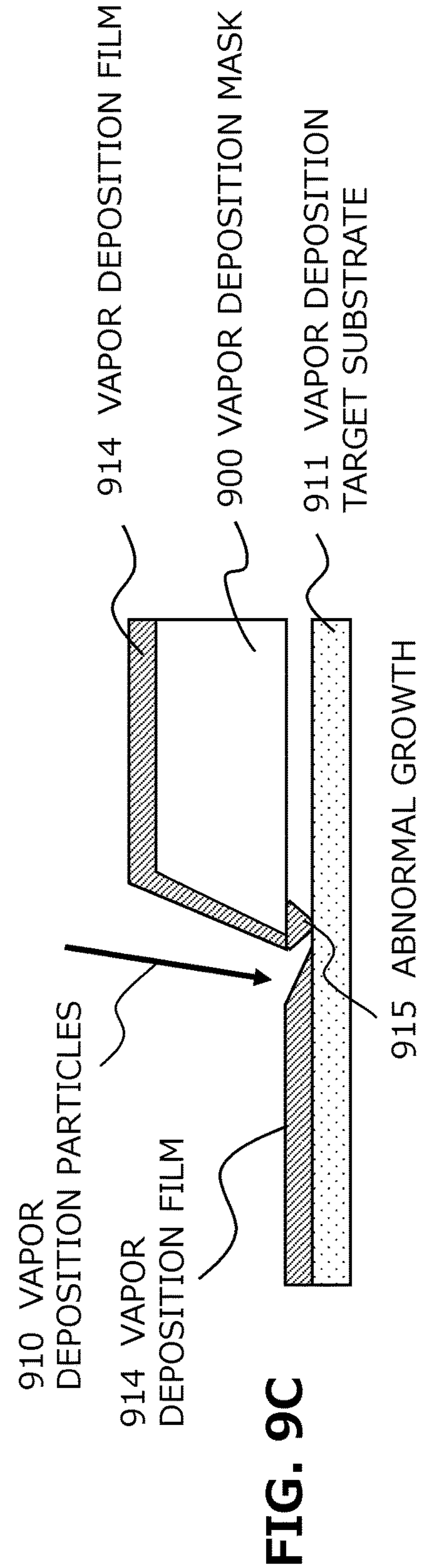
FIG. 9C is a schematic cross-sectional view of an opening of the vapor deposition mask of a prior art.

FIGS. 9A to 9C are schematic cross-sectional views of a vapor deposition mask 900 on which an opening 805 having a slanted cross-section is formed. FIG. 9A indicates a state of the vapor deposition mask 900 before a vapor deposition film 914 adheres, FIG. 9B indicates a state of the vapor deposition mask 900 in the initial stage of vapor deposition, and FIG. 9C indicates a state of the vapor deposition mask 900 in the later stage of vapor deposition.

The influence of shadow can be reduced by making the side wall of the opening 905 to be a slanted surface (tapered surface). However, if the vapor deposition particles 910 adhere to the vapor deposition mask 900, not only is the vapor deposition film 914 deposited on the side wall of the opening 905, but also the vapor deposition film 914 enters into the rear surface of the vapor deposition mask 900, and abnormal growth 915 is generated. Here the space between the vapor deposition mask 900 and the substrate 911 is set to be as small as possible, in order to prevent the blurring of pixels from being generated by the diffusion of vapor deposition particles 910. If the space between the vapor deposition mask 900 and the substrate 911 is small like this, the abnormal growth 915 contacts the substrate 911, as illustrated in FIG. 9C, becomes foreign substances, and generates pixel defects.

Embodiment 1

Embodiment 1 of the present invention will be described next. FIG. 1A is a schematic plan view of a vapor deposition mask 1 according to Embodiment 1, and FIG. 1B is a schematic cross-sectional view sectioned at a plane that passes through a line A-A' in FIGS. 1A and is vertical to the vapor deposition mask 1.

The vapor deposition mask 1 is constituted of a semiconductor substrate (e.g., monocrystal silicon), and has a first region 2 which includes a plurality of openings 5 (openings corresponding to pixels; pixel openings) where vapor deposition particles pass, and a second region 3 which surrounds the first region 2. Specifically, the first region 2 includes a plurality of pixel areas 8 which correspond to a plurality of chips respectively, and a plurality of openings 5 are disposed in each pixel area 8. The second region 3 surrounds the first region 2, and the thickness of the second region 3 is greater than the thickness of the first region 2 in order to support the first region 2.

In Embodiment 1, the first region 2 has a circular shape, and the second region 3 has an annular shape. For example, the outer diameter of the second region 3 is 100 mm to 300 mm. In Embodiment 1, the thickness of the first region 2 is 1 μm to 100 μm, and the thickness of the second region 3 is 100 μm to 775 μm.

In Embodiment 1, the vapor deposition mask 1 is constituted of an integrated substrate which includes the first region 2 and the second region 3. The material of the substrate is, for example, a silicon monocrystal, a silicon-on-insulator (SOI), or glass. The vapor deposition mask 1 may be configured by a mask portion corresponding to the first region 2 and an outer frame portion corresponding to the second region, which are bonded. In this case, the mask portion and the outer frame portion may be made from the same material or made from different materials. For the outer substrate, such a material as metal, ceramic or resin may be used, for example.

As illustrated in FIG. 1C, in a case of producing an organic electronic device using the vapor deposition mask 1, the vapor deposition mask 1 is placed on a mask holder 21. Vapor deposition particles 10 emitted from a vapor deposition source (not illustrated), which is on the opposite side (lower side in this figure) of a substrate 11, pass through the openings 5 of the vapor deposition mask 1, and reach the substrate 11. In the following description, the direction from the vapor deposition mask 1 to the vapor deposition source may be called the "down direction", and the direction from the vapor deposition mask 1 to the substrate 11 may be called the "up direction".

Figure 2:
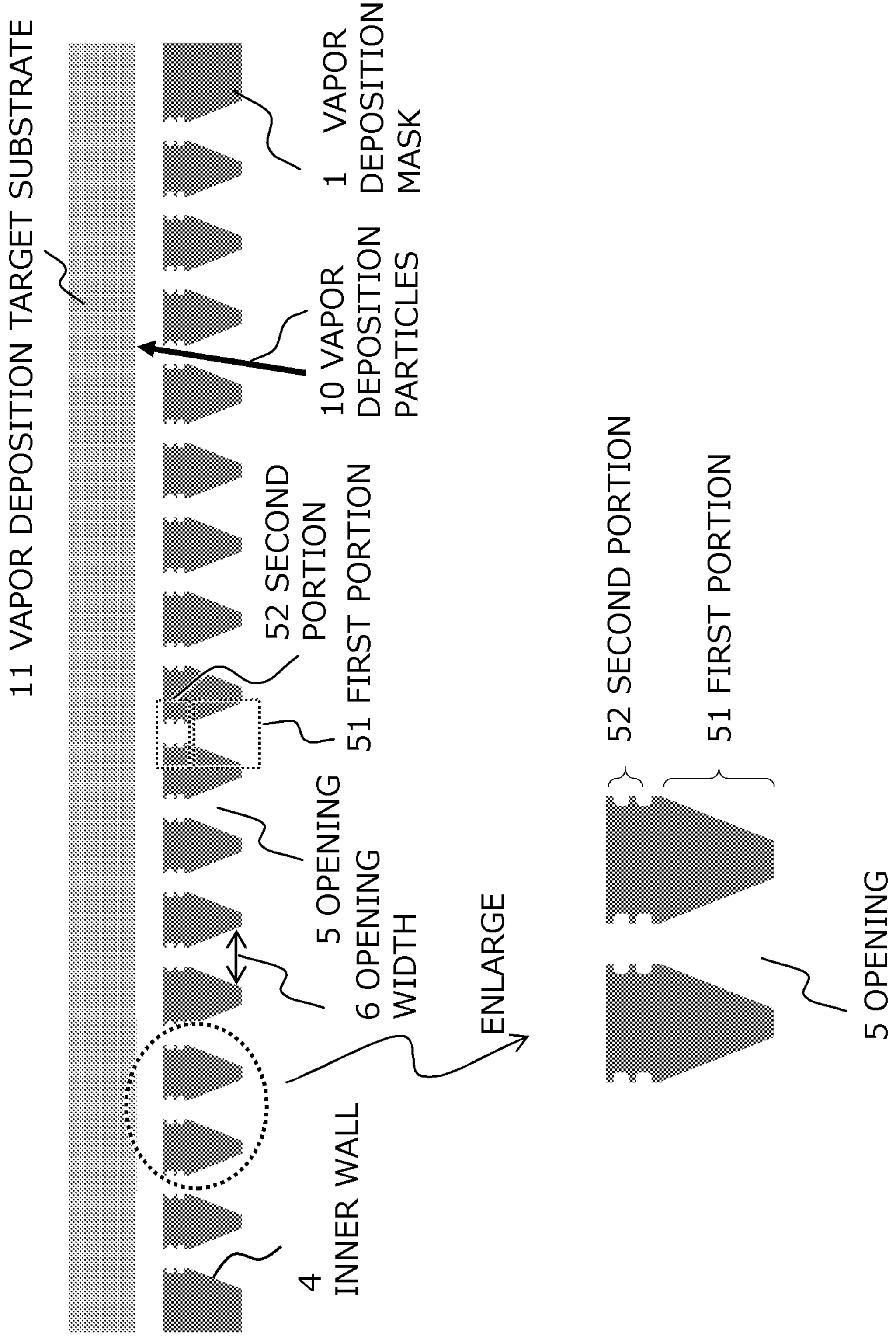
FIG. 2 is a schematic cross-sectional view of an opening of the vapor deposition mask of Embodiment 1.

FIG. 2 is a schematic cross-sectional view of the opening 5 where the vapor deposition particles 10 pass. The shape of the opening 5 in Embodiment 1 becomes larger in the down direction (direction to the vapor deposition source). Specifically, the opening 5 is constituted of a first portion (tapered portion) 51 having a tapered shape where the opening size gradually decreases (becomes narrower), and a second portion (straight portion) 52 where the opening size is approximately constant. The size of the opening may be evaluated by the width of the opening or by the area of the opening. The width of the opening may be, for example, a length of the diameter if the shape of the opening is a circle, or a length of a diagonal line if the shape of the opening is a rectangle.

In Embodiment 1, an inner wall of the second portion 52, which is the narrowest portion of the opening 5, has an uneven shape. FIGS. 3A to 3D are schematic cross-sectional views of the inner wall 4 of the second portion 52 of the opening 5. The inner wall has an uneven shape, and the narrowest portion of the opening is microscopically portioned portions of the uneven shape, but here the narrowest portion of the opening 5 is considered macroscopically in the order of about at least 10 times the film thickness of the vapor deposition film 14, for example.

Figures 3A, 3B, 3C, 3D:
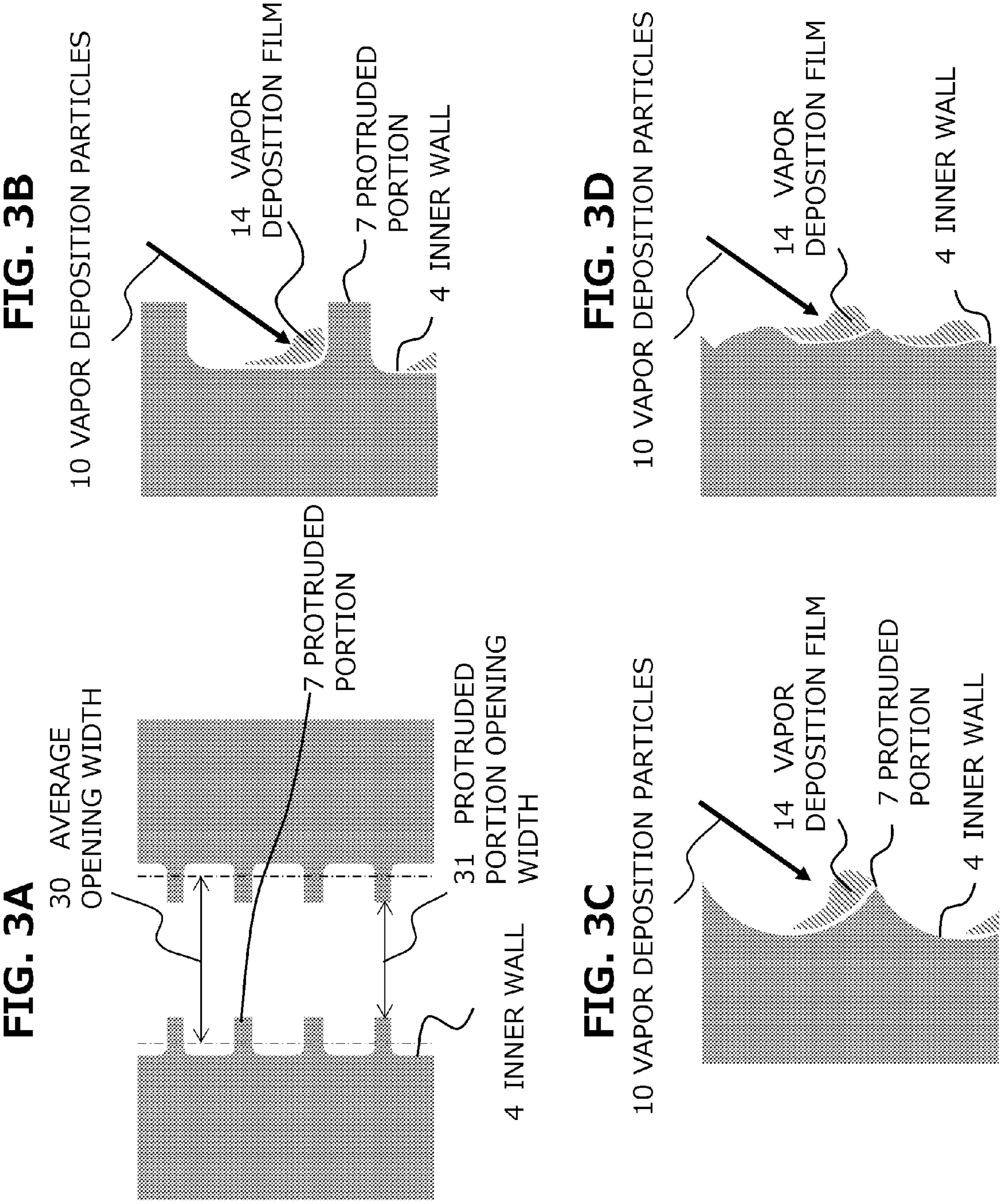
FIG. 3A is a schematic cross-sectional view of an opening of the vapor deposition mask of Embodiment 1.
FIG. 3B is a schematic cross-sectional view of an opening of the vapor deposition mask of Embodiment 1.
FIG. 3C is a schematic cross-sectional view of an opening of the vapor deposition mask of Embodiment 1.

FIG. 3A is an enlarged view of the inner wall 4 of the second portion 52, and FIG. 3B is an enlarged view further enlarging one side of the inner wall 4. In this example, the inner wall 4 has an uneven shape where a plurality of protruding portions 7, of which heights (step differences) are approximately constant, are formed. The height (step difference) of the protruding portion is at least a value equivalent to the film thickness of the vapor deposition film 14.

The height of each protruding portion 7 in the uneven shape (length of the protruding portion 7 in the direction vertical to the inner wall 4) is approximately constant in the depth direction of the opening. The height of the protruding portion 7 in the uneven shape is preferably at least a value equivalent to the thickness of the vapor deposition film 14. In Embodiment 1, the height of the protruding portion 7 in the uneven shape is defined as a difference between the average opening width 30 of the opening 5 (e.g., diameter, diagonal line) and the opening width 31 of the portion of the protruding portion 7 (e.g., diameter, diagonal line). The height of the protruding portion 7 in the uneven shape may be set to, for example 1 to 10 times or 2 to 5 times the thickness of the vapor deposition film 14. If the thickness of the vapor deposition film 14 is 10 nm, the height of the protruding portion 7 in the uneven shape can be 10 nm to 100 nm or 20 nm to 50 nm. If the thickness of the vapor deposition film 14 is 50 nm, the height of the protruding portion 7 in the uneven shape can be 50 nm to 500 nm or 100 nm to 250 nm. The thickness of the protruding portion 7 (length in the vertical direction) is preferably at most 2 times the thickness of the vapor deposition film 14.

The uneven shape of the rectangular protruding portions 7 mentioned above can be formed by using materials having different etching selectivity for the protruding portions 7 and the other portions. The height of the protruding portion 7 in the uneven shape can be controlled by using a material having an appropriate etching selectivity.

Figures 10A, 10B:
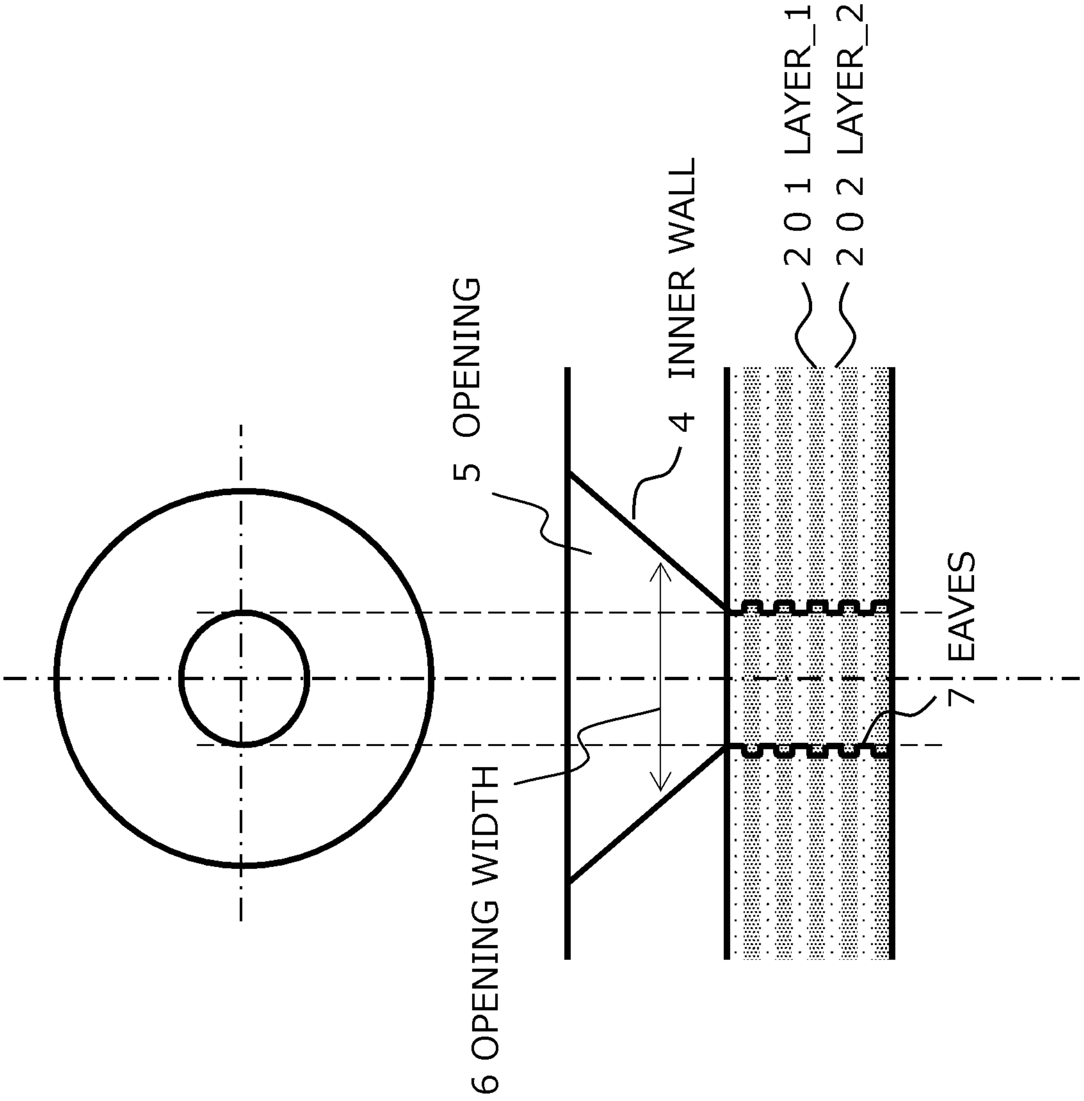
FIG. 10A is a schematic plan view of the opening of the vapor deposition mask of Embodiment 1/
FIG. 10B is a schematic cross-sectional view thereof.

FIG. 10 indicates a schematic cross-sectional view that same as FIG. 1C described in Embodiment 1, and a schematic plan view thereof. A part of the opening width 6 at each of the openings 5 of the vapor deposition mask 1 is narrower. The narrowest portion of the opening 5 has a side wall which is uneven. The inner wall of each of the openings 5 is constituted of layers made from different materials, of which etching rates are different. If materials having different etching rates are used, not only the etching rates in the depth direction but also the etching rates in the lateral direction are different in the dry etching or wet etching processing steps, hence a layer having a narrow opening width 6 and a layer having a wide opening width 6 are formed, and as a result, the inner wall of the opening 5 becomes a uneven side surface.

FIG. 3C is an enlarged view of one side of the inner wall 4 of the second portion 52 and is another example of the uneven shape. In this example, the inner wall 4 has an uneven shape, where a plurality of protruding portions 7, of which heights change continuously and cyclically, are formed on the inner wall 4 over a plurality of cycles.

It is preferred that the height of each protruding portion 7 in the uneven shape (length of the protruding portion 7 in the direction vertical to the inner wall 4) is at least the same as the thickness of the vapor deposition film 14. In this example, the height of the protruding portion 7 in the uneven shape is defined as the difference of the length in the horizontal direction between the portion where the length in the vertical direction from the inner wall 4 is the shortest, and the portion where this length is longest (difference of the length in the horizontal direction between the highest portion and the lowest portion). The height of the protruding portion 7 in the uneven shape may be, for example, 1 to 10 times or 2 to 5 times the thickness of the vapor deposition film 14.

The repetition cycle of the wavy protruding portions 7 in the uneven shape is preferably short since the surface becomes flat if the repetition cycle is too long. The repetition cycle of the protruding portions 7 is preferably at most 5 times or at most 2 times the film thickness of the vapor deposition film 14, for example.

The above-mentioned uneven shape of the wavey protruding portions 7 can be formed using a Bosch process, which is a known as deep etching for silicon, for example. In a Bosch process, scallops having a cyclic step difference are formed on the side wall by alternating gas.

When the vapor deposition particles 10 reach the protruding portions 7 on the inner wall 4 having the uneven shape indicated in FIGS. 3A to 3C, the vapor deposition film 14 is supported by the protruding portions 7 and is stably deposited on the inner wall 4. Since the inner wall 4 has a plurality of protruding portions 7, the adhesive force of the vapor deposition film 14 increases, and it can be prevented that the vapor deposition film 14 peels off and becomes foreign substances.

In FIGS. 3B and 3C, protruding portions 7 having a cyclic structure are formed, but similar effects can be implemented if there is sufficiently sized unevenness on the inner wall 4. Therefore, a non-cyclic shape having a surface roughness Ra may be formed on the inner wall 4, as indicated in FIG. 3D. In other words, the uneven shape on the inner wall 4 may be a rough surface having a surface roughness Ra. Here the surface roughness Ra is preferably at least the value of the thickness of the vapor deposition film 14. The surface roughness Ra of the inner wall 4 may be 1 to 10 times or 2 to 5 times the thickness of the vapor deposition film 14. For example, the surface roughness Ra is set to at least 10 nm.

In Embodiment 1, the uneven shape is formed on the inner wall 4 of the second portion 52, which is the narrowest portion of the opening 5, but the uneven shape may also be formed on the inner wall of the tapered first portion 51. The opening portion 5 is constituted of the tapered first portion 51 and the straight second portion 52 in sequence from the vapor deposition source side, but the second portion 52 may be tapered, of which opening width reduction rate is smaller (closer to parallel) than the first portion 51. In this case, the uneven shape is formed on the inner wall 4 of the periphery of the narrowest portion of the second portion or on the entire inner wall 4.

A part of the steps of fabricating an organic light-emitting diode (OLED), which is an example of an organic electronic device using the vapor deposition mask of Embodiment 1, will now be described.

As indicated in FIG. 1C, the vapor deposition mask 1 is disposed such that the upper surface of the vapor deposition mask 1 faces the lower surface of the substrate 11. After aligning the position of the vapor deposition mask 1 to the substrate 11, a vapor deposition source (not illustrated), located on the lower side of the vapor deposition mask 1 (on the opposite side of the substrate 11), is heated, to emit the vapor deposition particles 10 from the vapor deposition source. The emitted vapor deposition particles 10 pass through the openings 5 of the vapor deposition mask 1 and reach the substrate 11. Thereby the vapor deposition particles 10 are deposited on the substrate.

The vapor deposition particles 10 here refer to organic light-emitting materials, and, for example, an organic material that emits red (R) light, an organic material that emits green (G) light, and an organic material that emits blue (B) light may be selected respectively for the vapor deposition particles 10. In this case, the 3 types of organic materials need to be vapor-deposited (formed as film) at desired positions (different positions) respectively. Therefore 3 vapor deposition masks 1, which correspond to R, G and B respectively (specifically 3 vapor deposition masks 1 of which positions of the openings 5 are different from each other), are used. The width of the opening 5 can be as small as several μm in accordance with the size of the pixel.

An example of vapor-depositing a plurality of organic materials having different light-emitting colors was described, but the present invention is not limited to this. For example, an OLED, where only organic material, which emits white light, is used as the vapor deposition particles 10, and the white light is changed to red light, green light and blue light using color filters, may be produced. In this case, in each pixel area 8, one opening having approximately the same size as the pixel area 8 may be disposed. The width of this opening may be freely selected in the 0.1 mm to 100 mm range, for example.

By using the vapor deposition mask 1 of Embodiment 1, blocking of the openings 5 by the vapor deposition film 14 and the generation of foreign substances can be prevented even if higher definition is attained for the openings 5. Furthermore, such a high-definition organic electronic device as OLED can be produced at high yield.

Embodiment 2

Figure 4:
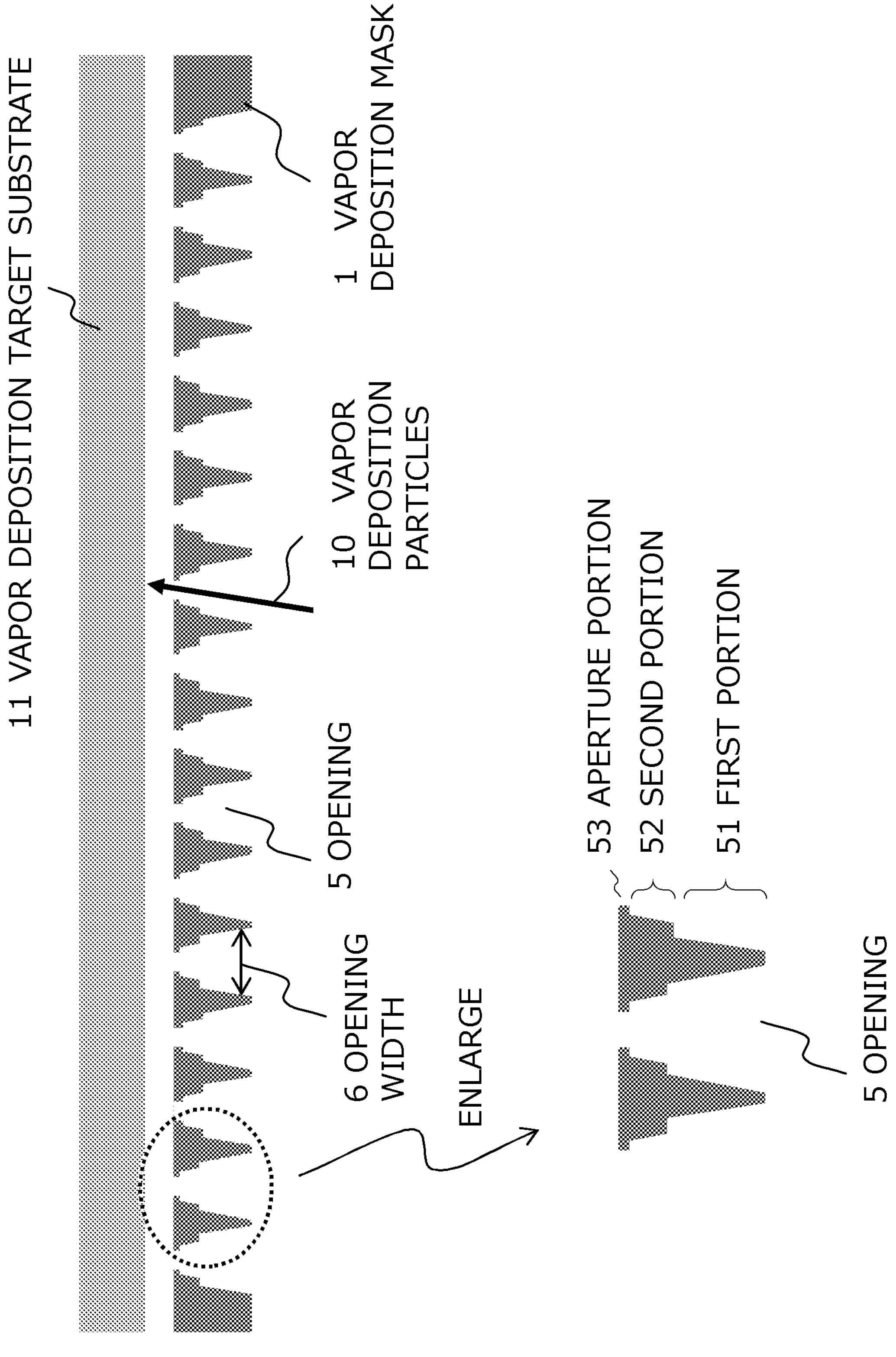
FIG. 4 is a schematic cross-sectional view of an opening of a vapor deposition mask of Embodiment 2.

Embodiment 2 of the present invention will now be described with reference to FIG. 4. FIG. 4 is a schematic cross-sectional view of the same section as FIG. 2 described in Embodiment 1. The opening width of a part of the opening 5 of the vapor deposition mask 1 is even narrower, and the opening width 6 at a portion closest to the substrate 11 is the narrowest.

Specifically, the opening 5 of Embodiment 2 is constituted of a first portion 51, a second portion 52, and an aperture portion 53 in sequence from the vapor deposition source side (lower side in FIG. 4). The first portion 51 and the second portion 52 are tapered where the opening width gradually decreases. The size of the opening changes discontinuously where the first portion 51 and the second portion 52 are connected, and the size of the opening at the lower end of the second portion 52 is smaller than the size of the opening at the upper end of the first portion 51. The aperture portion 53 is disposed at the edge of the vapor deposition mask on the substrate side, and the opening width 6 is narrowest because of the protruding portions. The uneven shape, similar to Embodiment 1, may be disposed on the inner wall of the second portion 52 and the aperture portion 53.

According to the structure of Embodiment 2, in a portion other than the aperture portion 53, which is the narrowest opening, the adhered vapor deposition particles 10 do not block the opening 5. Even if the vapor deposition particles 10 peel off and become foreign substances, the aperture portion 53 prevents the foreign substances from reaching the substrate 11. Therefore, according to Embodiment 2, a vapor deposition mask that can produce an organic electronic device at high yield can be provided.

Embodiment 3

Figure 5:
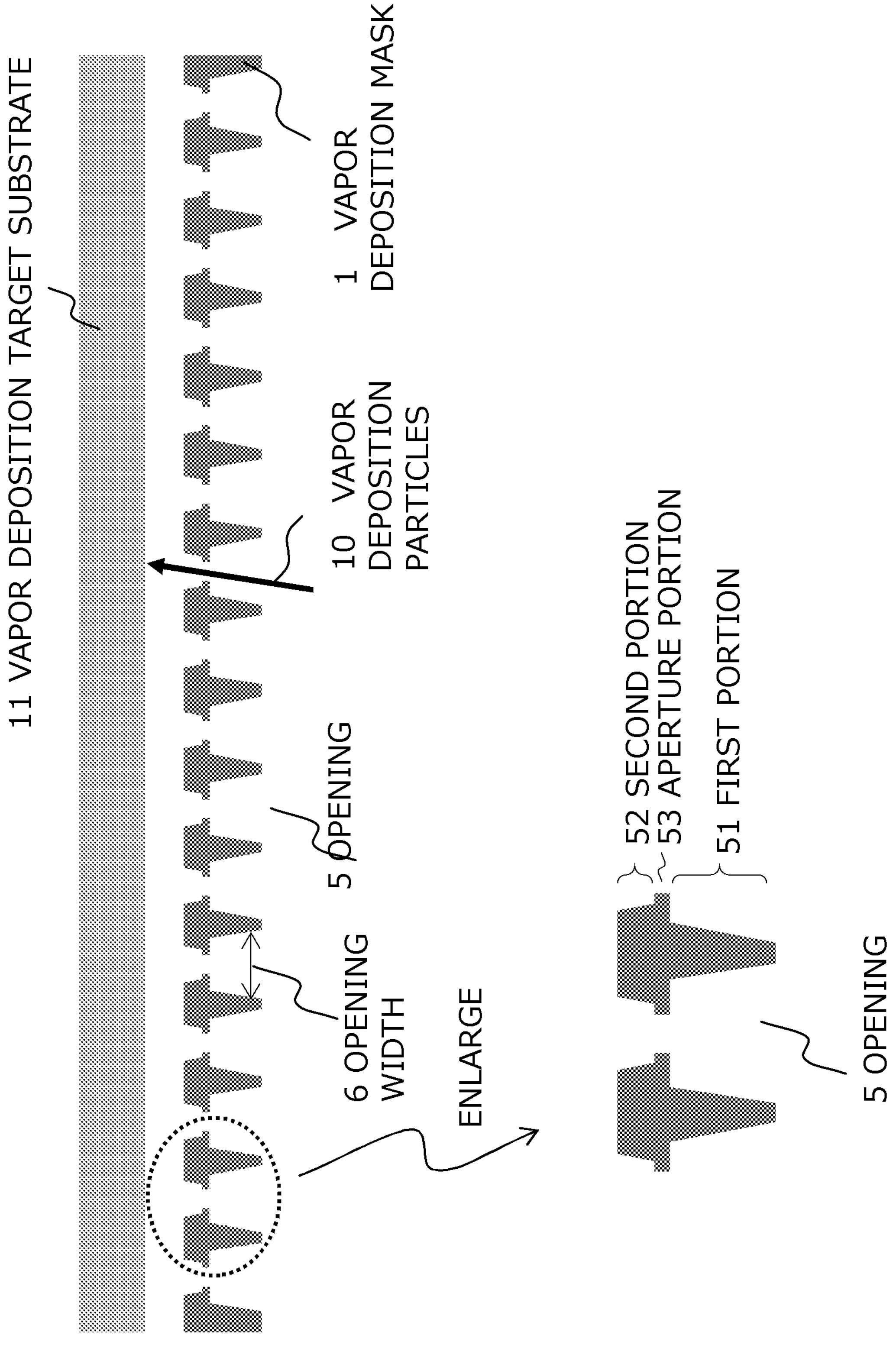
FIG. 5 is a schematic cross-sectional view of an opening of a vapor deposition mask of Embodiment 3.

Embodiment 3 of the present invention will now be described with reference to FIG. 5. FIG. 5 is a schematic cross-sectional view of the same section as FIG. 2 described in Embodiment 1. In Embodiment 3, a portion of which the opening width 6 is narrowest exists between the upper end and the lower end of the opening 5 of the vapor deposition mask 1, and the opening width 6 at the portion closest to the substrate 11 is wider than the narrowest portion.

Specifically, the opening 5 of Embodiment 3 is constituted of a first portion 51, an aperture portion 53 and a second portion 52 in sequence from the vapor deposition source side (lower side in FIG. 5). The first portion 51 is tapered where the opening width gradually decreases, and the second portion 52 is inversely tapered where the opening width gradually increases. The aperture portion 53 is disposed between the first portion 51 and the second portion 52, and the opening width 6 is narrowest in this portion. The uneven shape similar to Embodiment 1 may be disposed on the inner wall of the second portion 52 and the aperture portion 53.

According to the configuration of Embodiment 3, in a portion other than the aperture portion 53, which is the narrowest opening, the adhered vapor deposition particles 10 do not block the opening 5. Even if the vapor deposition particles 10 peel off and become foreign substances, the aperture portion 53 prevents the foreign substances from reaching the substrate 11. Further, even if the vapor deposition particles 10 enter into the rear side of the aperture portion 53 and generates abnormal growth, the vapor deposition particles 10 never contact the substrate 11, hence foreign substances are not generated. Therefore, according to Embodiment 3, a vapor deposition mask that can produce an organic electronic device at high yield can be provided.

Embodiment 4

Figure 6:
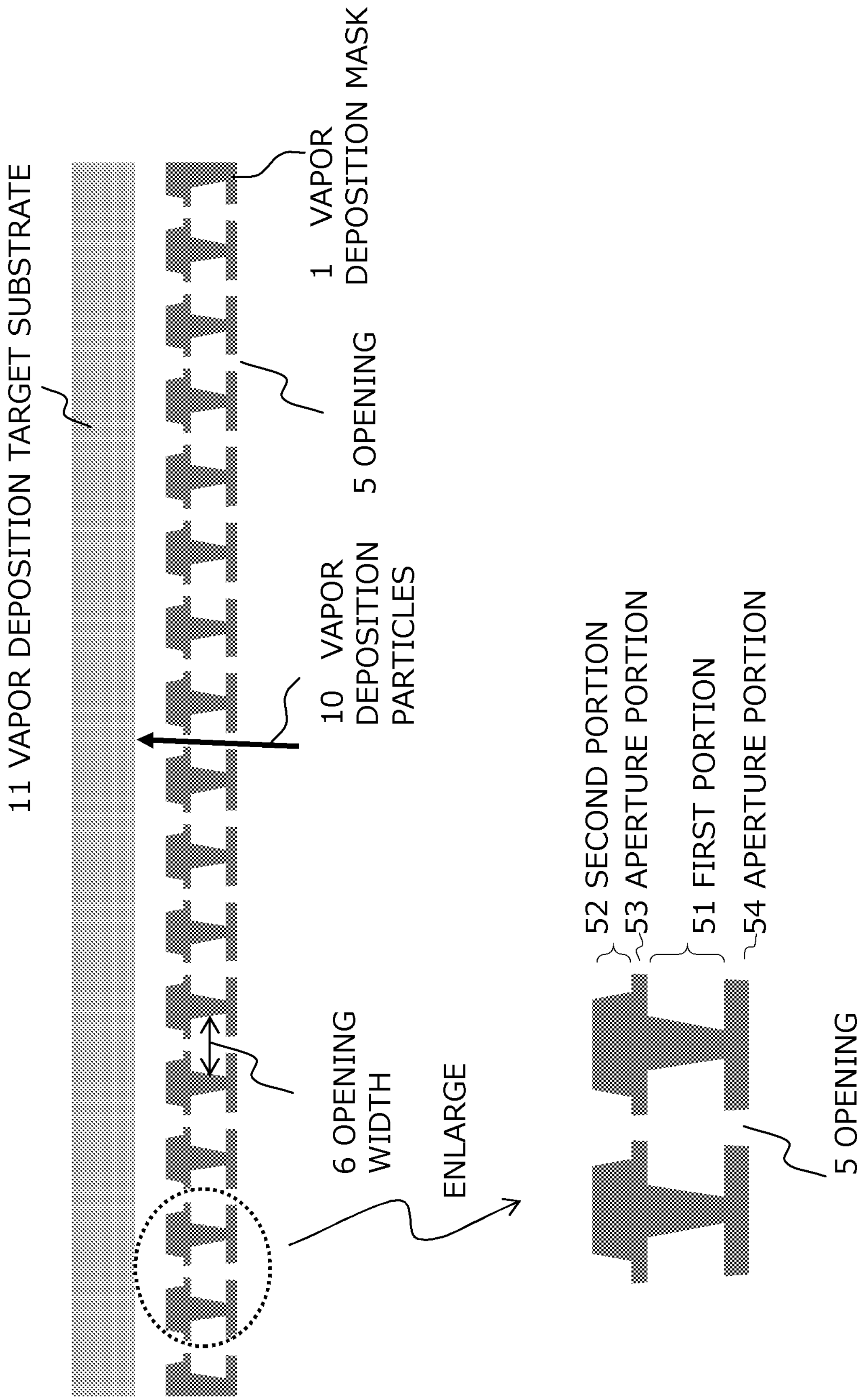
FIG. 6 is a schematic cross-sectional view of an opening of a vapor deposition mask of Embodiment 4.

Embodiment 4 of the present invention will now be described with reference to FIG. 6. FIG. 6 is a schematic cross-sectional view of the same section in FIG. 2 described in Embodiment 1. In Embodiment 4, in addition to the configuration of Embodiment 3, an opening width 6 at a position most distant from the substrate 11 is as narrow as the narrowest position.

Specifically, the opening 5 of Embodiment 4 is constituted of an aperture portion 54, a first portion 51, an aperture portion 53 and a second portion 52 in sequence from the vapor deposition source side (lower side in FIG. 6). The first portion 51 is tapered where the opening width gradually decreases, and the second portion 52 is inversely tapered where the opening width gradually increases. The aperture portion 54 is disposed at a position closest to the vapor deposition source (position most distant from the substrate 11). The aperture portion 53 is disposed between the first portion 51 and the second portion 52. The opening width 6 of the aperture portion 53 and that of the aperture portion 54 are approximately the same, and the opening width 6 is the narrowest in these portions. The opening width 6 of the aperture portion 53 and that of the aperture portion 54 need not be exactly the same, and the opening width 6 of the aperture portion 54 may be wider than the opening width 6 of the aperture portion 53. The uneven shape similar to Embodiment 1 may be formed on the inner wall of the second portion 52 and the aperture portions 53 and 54.

According to the configuration of Embodiment 4, at a portion other than the aperture portions 53 and 54 which are the narrowest openings, the adhered vapor deposition particles 10 do not block the opening 5. Even if the vapor deposition particles 10 peel of and become foreign substances, the aperture portion 53 prevents the foreign substances from reaching the substrate 11. Further, even if the vapor deposition particles 10 enter into the rear side of the aperture portion 53 and generate abnormal growth, the vapor deposition particles 10 never contact the substrate 11, hence foreign substances are not generated. Furthermore, 2 aperture portions 53 and 54 exist, hence only vapor deposition particles 10 having high straight propagation properties are deposited on the substrate. For these reasons, therefore, according to Embodiment 4, a vapor deposition mask that has high performance can produce an organic electronic device at high yield can be provided.

Embodiment 5

Embodiment 5 of the present invention will now be described with reference to FIGS. 11 and 12.

FIGS. 11B and 11D and FIG. 12B are schematic cross-sectional views the same as FIG. 2 described in Embodiment 1. FIGS. 11A and 11C, FIGS. 12A, and FIGS. 12C to 12F are schematic plan views.

In the example indicated in FIGS. 11A and 11B, the cross-sectional shape of the narrowest portion of the opening 5 is a polygon. In other words, in this example, the opening width 6 in a part of the opening 5 of the vapor deposition mask 1 is narrower or wider than the average diameter of the narrowest portion of the opening 5, depending on the portion in the circumferential direction of the inner wall of the opening 5. This means that the opening 5 is constituted of an inner wall of which distances from the center are different depending on the portion. Further, as indicated in FIGS. 11C and 11D, the portion of having the polygonal cross-sectional shape of the opening 5 may be tapered where the opening width decreases as the depth increases.

The cross-sectional shape of the opening 5 may be arbitrary only if the distance from the center is different, depending on the portion in the circumferential direction, as illustrated in FIG. 12A and FIGS. 12C to 12F. In other words, the inner wall of the narrowest portion of the opening 5 is not a circle but a polygon. A number of vertexes of the polygon is preferably at least 3 and less than 20. The interior angle of each vertex of the polygon is preferably an alternate of an angle of not more than 180° and an angle of at least 180°. The vertex of the polygon may be an acute angle or chamfered.

Since the cross-sectional shape is a polygon, the uneven shape is formed on the inner wall of the narrowest portion of the opening 5. In other words, the vertex portions of the polygonal cross-sectional shape have the same effect as the protruding portions 7 in Embodiment 1 or the like, and the vapor deposition film is supported by the protruding portions and is stably deposited on the inner wall. Since the inner wall has the protruding portions, the adhesive force of the vapor deposition film increases, and it can be prevented that the vapor deposition film peels off and becomes foreign substances.

In Embodiment 5, vertical grooves in the depth direction are formed on the inner wall of the narrowest portion of the opening 5. In terms of regenerating the vapor deposition mask, the vertical grooves in the depth direction do not interfere with melting, evaporation, or sublimation of the vapor deposition film very much in the process of removing the adhered vapor deposition film. In other words, a chemical solution to dissolve the vapor deposition film can be poured along the vertical grooves in the depth direction. Further, by heating the vapor deposition film, the vapor deposition film evaporates and is released along the vertical grooves in the depth direction. Therefore, the vapor deposition mask can easily be regenerated, and such desirable effects as a shorter regeneration time and less residue of the vapor deposition film after regeneration can be implemented.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A vapor deposition mask made of a semiconductor substrate having a first surface and a second surface and comprising an opening, which penetrates the semiconductor substrate between the first surface and the second surface,
- wherein an inner wall facing the opening includes a protruding portion between an edge of the opening on a first surface side and an edge of the opening on a second surface side,
- wherein the inner wall is tapered such that an opening width of the inner wall increases towards the edge on the first surface side between the edge on the first surface side and the protruding portion, and
- wherein the protruding portion is a portion of the inner wall where a distance from a center of the opening to the inner wall varies, depending on a portion in a circumferential direction of the opening.

2. The vapor deposition mask according to claim 1, wherein the protruding portion is a portion of the inner wall where the opening width of the inner wall is smallest in a depth direction of the opening.

3. The vapor deposition mask according to claim 1, wherein the inner wall comprises protruding portions which include the protruding portion and of which heights are approximately constant.

4. The vapor deposition mask according to claim 3, wherein a length of the protruding portion from a bottom to top of the protruding portion is equal to or greater than a thickness of a vapor deposition film to be deposited.

5. The vapor deposition mask according to claim 1, wherein the inner wall comprises protruding portions which include the protruding portion and of which heights cyclically change for a plurality of cycles.

6. The vapor deposition mask according to claim 5, wherein a length as a repetition cycle of the protruding portions is equal to or less than 5 times the thickness of a vapor deposition film to be deposited.

7. The vapor deposition mask according to claim 5, wherein the protruding portion comprises a plurality of layers of which materials are different, and an etching rate is different between the plurality of layers.

8. The vapor deposition mask according to claim 1, wherein the inner wall comprises protruding portions, a difference between a length of a first protruding portion of the protruding portions from bottom to top of the protruding portion and a length of a second protruding portion of the protruding portions is equal to or greater than a thickness of a vapor deposition film to be deposited, and the difference is smallest among differences between two of the protruding portions.

9. The vapor deposition mask according to claim 1, wherein the protruding portion is included in a portion of the inner wall, and surface roughness Ra of the portion of the inner wall is at least 10 nm.

10. The vapor deposition mask according to claim 1, wherein the first surface faces a vapor deposition source.

11. The vapor deposition mask according to claim 1, wherein an opening width is smallest on an edge of the opening on the second surface side in the opening, and the second surface faces a substrate which vapor deposition particles from a vapor deposition source reach.

12. The vapor deposition mask according to claim 1, wherein the opening has an aperture portion at which an opening width is smallest in the openings between the edge of the first surface side and the edge of the second surface side, the second surface faces a substrate which vapor deposition particles from a vapor deposition source reach, and the opening width increases as the distance from the aperture portion increases between the aperture portion and the edge of the second surface.

13. The vapor deposition mask according to claim 1, wherein the opening has an aperture portion at which an opening width is smallest in the openings between the edge of the first surface side and the edge of the second surface side, the first surface faces a vapor deposition source and the second surface faces a substrate which vapor deposition particles from the vapor deposition source reach, and a second aperture portion, which has an approximately same opening width as the aperture portion, is disposed on an edge of the opening on the first surface side.

14. The vapor deposition mask according to claim 1, wherein the semiconductor substrate is constituted of silicon monocrystals.

15. The vapor deposition mask according to claim 1, wherein the inner wall comprises protruding portions which include the protruding portion between the edge on the first surface side and the edge on the second surface side.

16. A method for producing an organic electronic device, wherein the vapor deposition mask according to claim 1 is disposed so as to face the substrate, and an organic material is vapor-deposited on the substrate through the vapor deposition mask.

17. A vapor deposition mask made of a semiconductor substrate having a first surface and a second surface and comprising an opening, which penetrates the semiconductor substrate between the first surface and the second surface,
- wherein an inner wall facing the opening includes a protruding portion between an edge of the opening on a first surface side and an edge of the opening on a second surface side,
- wherein the inner wall is tapered such that an opening width of the inner wall increases towards the edge on the first surface side between the edge on the first surface side and the protruding portion, and
- wherein the inner wall comprises protruding portions which include the protruding portion and of which heights cyclically change for a plurality of cycles.

18. A vapor deposition mask made of a semiconductor substrate having a first surface and a second surface and comprising an opening, which penetrates the semiconductor substrate between the first surface and the second surface,
- wherein an inner wall facing the opening includes a protruding portion between an edge of the opening on a first surface side and an edge of the opening on a second surface side,
- wherein the inner wall is tapered such that an opening width of the inner wall increases towards the edge on the first surface side between the edge on the first surface side and the protruding portion, and
- wherein the protruding portion is included in a portion of the inner wall, and surface roughness Ra of the portion of the inner wall is at least 10 nm.

* * * * *